United States Patent [19]

Sato et al.

[11] Patent Number: 4,968,375
[45] Date of Patent: Nov. 6, 1990

[54] ETCHING APPARATUS

[75] Inventors: Mitsuo Sato, Zama; Kiyoshi Yoshikawa, Kawasaki; Takashi Fujiwara, Yokohama, all of Japan

[73] Assignee: Kabushiki Kaisha Toshiba, Kanagawa, Japan

[21] Appl. No.: 433,165

[22] Filed: Nov. 8, 1989

[30] Foreign Application Priority Data

Nov. 11, 1988 [JP] Japan ................... 63-285285

[51] Int. Cl.⁵ ............... H01L 21/306; B44C 1/22; C03C 15/00; C03C 25/06
[52] U.S. Cl. ................... 156/345; 134/32; 134/198; 156/640; 156/657; 156/662
[58] Field of Search ........... 156/345, 639, 640, 654, 156/657, 662; 134/26, 27, 28, 30, 32, 137, 144, 198

[56] References Cited

U.S. PATENT DOCUMENTS 4,339,297 7/1982 Aigo ..................... 156/345
4,350,562 9/1982 Bonu ................... 156/345 X Primary Examiner—William A. Powell
Attorney, Agent, or Firm—Banner, Birch, McKie & Beckett

[57] ABSTRACT

A semiconductor substrate etching apparatus is disclosed. In this apparatus, a semiconductor substrate is mounted on the upper surface of a first vacuum chuck, an etching solution is supplied to a groove of a roller of a semiconductor substrate end surface etching mechanism, which covers the end surface of the semiconductor substrate, and the first vacuum chuck and the roller are rotated in the opposite directions. The end surface of the semiconductor substrate is brought into contact with the etching solution. The etching solution is then transferred onto the end surface of the substrate, thus performing etching of the end surface.

2 Claims, 4 Drawing Sheets

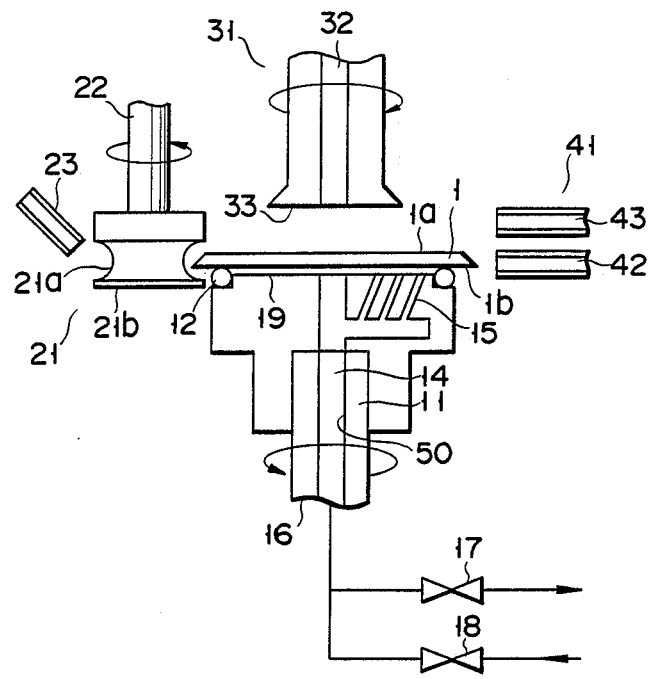
F I G. 2A
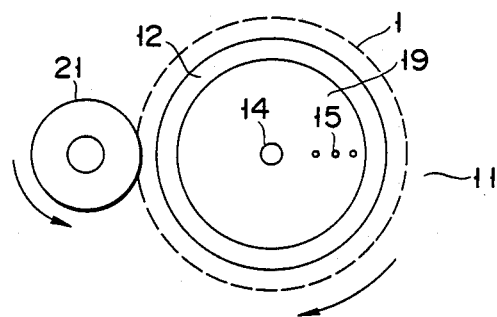
F I G. 2B

ETCHING APPARATUS

BACKGROUND OF THE INVENTION

1. Field of the Invention

The present invention relates to an etching apparatus for semiconductor substrates (also called wafers) and, more particularly, to an etching apparatus for etching the end surfaces of semiconductor substrates.

2. Description of the Related Art

In the manufacture of semiconductor devices, an etching process is sometimes performed for only the end surface surface of a semiconductor substrate. For example, a disk-like wafer having no orientation flat is used as a semiconductor substrate for a large-power semiconductor device or the like, and the side surface of the wafer is inclined with respect to the major surfaces of the wafer so as to form a bevel structure to maintain a prescribed breakdown voltage. Since cracks and defects are produced on the inclined side surface of the wafer during beveling, they must be removed by etching. Such a conventional technique for etching only the end surface of a wafer will be described with reference to the accompanying drawings.

As shown in FIG. 1A, after one major surface of a wafer 1 is entirely coated with an antietching solution 2 using a brush, the wafer 1 is bonded to a fluoroplastic disk 3 having the same diameter as that of the wafer 1. The wafer 1 and the disk 3 are then placed on a hot plate with the disk 3 facing down, and are baked for several minutes to be fixed on each other. After baking, the other major surface (pattern formation surface) of the wafer 1 is coated with the antietching solution 2 using a brush. The wafer 1 is then baked in the same manner as described above. In the above-described process, it is essential to prevent adhesion of the antietching solution to the end surface of the wafer 1.

As shown in FIG. 1B, the above-described wafer with the fluoroplastic disk is picked up with tweezers 4 and is immersed in an etching solution 6 in an etching solution tank 5 for a predetermined period of time, thus etching only the end surface of the wafer. After etching, the etching solution is completely removed from the wafer with the disk by cleaning with water. In addition, the wafer is immersed in a boiling organic solution so as to peel off the disk 3 from the wafer 1 and to remove the antietching solution. Upon removal of the antietching solution, the wafer is picked up with the tweezers and is swung in a water flow tank to clean it. After cleaning, as shown in FIG. 1C, the wafer is placed below an ultraviolet lamp 7 to dry it.

The following problems are posed in the above-described conventional etching means. (1) An antietching solution must be carefully coated on the major surfaces of a wafer so as to prevent the solution from adhering to the end surface of the wafer. Hence, the coating step requires a long period of time. (2) It takes an undesirably long period of time to bond a fluoroplastic disk to the wafer while preventing adhesion of the antietching solution to the end surface of the wafer. (3) In order to remove the hardened antietching solution after the wafer is immersed in the etching solution, the cumbersome subsequent steps are required: immersing the wafer in a boiling organic solution; cleaning in flowing water; and drying by means of a lamp. (4) After the fluoroplastic substrate is peeled off from the wafer, the wafer is picked up with tweezers so as to be set or reset in a drying process by means of a lamp. For this reason, the end surfaces of wafers tend to break (chip), resulting in a decrease in yield. (5) Since the coating film of an antietching solution on both the major surfaces of a wafer varies in thickness, the manufacturing yield is decreased. (6) Since an operator is required to perform a large number of steps, such as coating an antietching solution, bonding a fluoroplastic disk, peeling the antietching solution and the disk, and drying by means of a lamp, automation is delayed and a long period of time is required for these steps. (7) Large amounts of etching solution and organic solution are used. (8) Since harmful solutions are used, pollution problems are posed. (9) The delivery date of products is difficult to keep because of a large number of steps.

As described above, in the conventional technique, the number of steps to be performed by an operator is large, and it is difficult to uniformly etch the end surface of a wafer, thus position problems in terms of quality and yield. In addition, a long period of time is required for the respective steps, such as etching, cleaning, and drying, and large amounts of etching solution, organic solution, and the like are used, thus posing a problem in terms of safety with respect to a human body.

SUMMARY OF THE INVENTION

It is an object of the present invention to provide a semiconductor substrate etching apparatus, which can solve the various problems of the above-described conventional technique, and which can uniformly and automatically perform an etching process for only the end surface of a wafer in a short period of time, and can continuously and automatically perform cleaning and drying steps, thereby increasing the manufacturing yield, shortening the time required for the steps, reducing the amounts of chemicals to be used, and improving safety in operations.

According to the present invention, there is provided a semiconductor substrate etching apparatus comprising: a rotatable first vacuum chuck having an elastic seal member, mounted around a peripheral portion of an upper surface thereof and having a diameter smaller than that of a semiconductor substrate (wafer), for holding the substrate in a horizontal state in contact with one major surface (to be referred to as a lower surface hereinafter) of the substrate, and a plurality of exhaust holes communicating with a hollow portion as an exhaust path therein and extending obliquely outward to open in the upper surface thereof, openings of the exhaust holes being arranged from the center of the upper surface to a periphery thereof in a straight line; a semiconductor substrate end surface etching mechanism including a roller arranged near the semiconductor substrate in a horizontal state and having a groove which is formed in an outer surface thereof so as to allow the end surface of the substrate to be inserted in a non-contact state and to cover the end surface, and means for supplying an etching solution, which is brought into contact with the end surface of the substrate, to the groove of the roller; a rotatable or non-rotatable second vacuum chuck, which can be horizontally and vertically moved and, which can hold the other major surface of the semiconductor substrate by suction and move the substrate to an upper position a predetermined distance away from the upper surface of the first vacuum chuck; an end surface cleaning nozzle, arranged to oppose a side surface of the semiconductor substrate held by the first vacuum chuck, for spraying a cleaning solution on the end surface thereof; a semiconductor substrate cleaning mechanism, arranged to oppose a side surface of a region defined by the predetermined distance between the upper surface of the first vacuum chuck and the lower surface of the substrate held by the second vacuum chuck, for spraying a cleaning solution on the region; and a semiconductor substrate drying mechanism for drying the lower surface of the semiconductor substrate by discharging a drying gas from the plurality of exhaust holes of the rotating first vacuum chuck onto the lower surface, and for drying the upper surface of the semiconductor substrate held by the first vacuum chuck upon rotation thereof.

Note that the end surface of the semiconductor substrate is the side surface of the substrate including the peripheral portions of both the major surfaces of the substrate.

The etching solution is supplied to the groove of the roller of the semiconductor substrate end surface etching mechanism from the etching solution supply means, e.g., an etching solution supply nozzle arranged near the roller. The etching solution substantially fills the groove by surface tension. Upon rotation of the roller and the first vacuum chuck, the end surface of the substrate is brought into contact with the etching solution with which the groove is filled, and part of the etching solution is transferred onto the end surface of the substrate, thereby performing an etching process. Since the etching solution is always replenished upon rotation of the roller and the substrate, a uniform and efficient etching process can be performed. The etching solution adhering to the peripheral portion of the upper surface of the substrate does not flow inward from the peripheral portion due to the centrifugal force generated upon rotation of the substrate. The etching solution adhering to the peripheral portion of the lower surface of the substrate does not flow to the inner portion of the lower surface because of the elastic seal member which is in tight contact with the substrate. When the substrate is directly chucked to the upper surface of the chuck without an elastic seal member, the phenomenon that an etching solution enters the inner portion of a substrate by vacuum suction was often recognized. By adding an elastic seal member, an etching region can be reliably limited to only the end surface of a substrate. After etching, the end surface of the substrate is cleaned by the cleaning solution sprayed from the end surface cleaning nozzle.

Upon cleaning of the end surface, the semiconductor substrate is held by the second vacuum chuck by suction, and is moved upward and stopped at an upper position the predetermined distance away from the upper surface of the first vacuum chuck. The lower surface of the substrate and the upper surface of the first vacuum chuck are cleaned by the cleaning solution sprayed from the cleaning nozzle of the semiconductor substrate cleaning mechanism. During this cleaning operation, the drying gas is discharged from the exhaust holes open to the upper surface of the first vacuum chuck so as to prevent the cleaning solution from flowing in the exhaust holes. Since the first vacuum chuck is rotated, the flow of the gas sprayed from the rotating exhaust holes acts on the flow of the cleaning solution so as to shorten the time for cleaning. After cleaning, only the drying gas is fed to dry the upper surface of the first vacuum chuck and the lower surface of the substrate. Since the openings of the exhaust holes from which the drying gas is sprayed are arranged from the center of the upper surface of the rotating chuck to its periphery in a straight line, a surface to be treated can be uniformly dried within a short period of time. Note that the above-described effect can be obtained either by rotating the second vacuum chuck, which holds the substrate, or not rotating it during the cleaning and drying steps. However, the second vacuum chuck is preferably rotated in a direction opposite to that of the first vacuum chuck in order to enhance the above effect.

Subsequently, the semiconductor substrate is held on the elastic seal member of the first vacuum chuck again in tight contact therewith. In this state, the cleaning solution is sprayed from the cleaning nozzle on the upper surface of the substrate so as to clean it. After cleaning, the first vacuum chuck is rotated at high speed to dry the upper surface of the substrate. In order to perform the drying operation within a short period of time, the first vacuum chuck is preferably rotated at a high rotational speed of at least 2,000 rpm or more.

BRIEF DESCRIPTION OF THE DRAWINGS

FIG. 2A is a view showing an arrangement of a semiconductor substrate etching apparatus according to the present invention;

FIG. 2B is a partial plan view of the semiconductor substrate etching apparatus of the present invention.

DETAILED DESCRIPTION OF THE PREFERRED EMBODIMENT

Figure 1A:
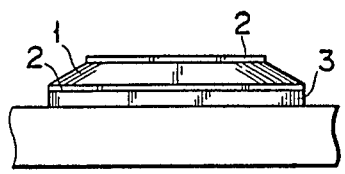
FIGS. 1A to 1C are views showing conventional semiconductor substrate etching steps.
Figure 1B:
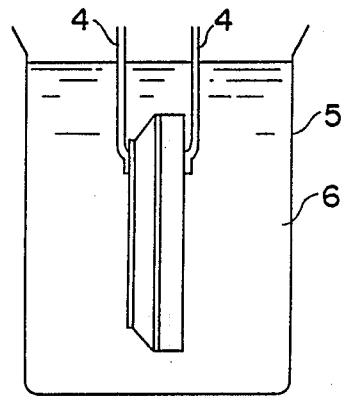
Figure 1C:
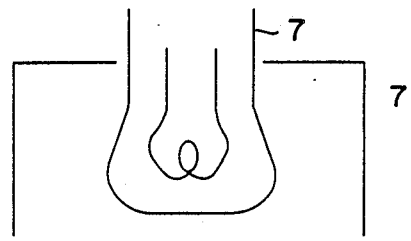
Figure 1C:

An embodiment of the present invention will be described below with reference to the accompanying drawings. FIGS. 2A and 2B are views for explaining an arrangement of a semiconductor substrate etching apparatus of the present invention. FIG. 2A is a front view including a partially sectional view. FIG. 2B is a partial plan view of the apparatus.

A rotary first vacuum chuck 11 includes an elastic seal member 12 (an O-ring is used in this embodiment, and hence the seal member 12 will be referred to as an O-ring hereinafter.) Reference numeral 1 denotes a semiconductor substrate (wafer) whose end surface is to be etched. The O-ring 12 is constituted by a high-modulus member and has a diameter smaller than that of the substrate 1. The O-ring 12 is in tight contact with one major surface (to be referred to as a lower surface hereinafter) 1b of the substrate 1 to hold the substrate 1 in a horizontal state. The O-ring 12 is fitted in a notched portion which is formed in the peripheral portion of an upper surface 19 of the first vacuum chuck 11. The first vacuum chuck 11 is fixed on a hollow rotating shaft 16. A hollow portion 14, as an exhaust path, is formed inside the first vacuum chuck 11 so as to communicate with the hollow portion of the rotating shaft 16. Several exhaust holes 15 are formed in the first vacuum chuck 11 so as to communicate with the hollow portion 14 and to obliquely extend outward at an angle of 45° or 60° to be open to the upper surface 19. The openings of the exhaust holes 15 are arranged from the center to the periphery in a straight line (see FIG. 2B). In this embodiment, the openings are radially arranged from the center of the upper surface in a straight line. However, the present invention is not limited to this. That is, the above arrangement may be curved or shifted from the radial direction. Alternatively, a plurality of such arrangements may be formed. The openings can be arranged in any of the above-described manners as long as they are inclined obliquely outward, as described above. The rotating shaft 16 is coupled to a rotational driving unit (not shown). The rotational speed of the rotating shaft 16 can be changed, and a rotational driving unit capable of rotating the shaft 16 at a high speed of 2,000 rpm or more as needed is used. One end of the hollow portion of the rotating shaft 16 is connected to a vacuum pipe line and an $N_2$ gas pipe line in parallel through valves 17 and 18, respectively.

An etching mechanism 21 for the end surface of a semiconductor substrate includes a roller 21b fixed on a rotating shaft 22, and an etching solution supply means (etching solution supply nozzle) 23. The roller 21b is arranged near the substrate 1 in a horizontal state. A groove 21a is formed in the outer surface of the roller 21b. The groove 21a is shaped so as to allow the end surface of the substrate 1 to be inserted in a non-contact state, i.e., to cover the end surface of the substrate. The etching solution supply means 23 is a nozzle which is arranged near the roller 21b so as to supply an etching solution to the groove 21a of the rotating roller 21b. Note that the etching solution supply means is not limited to the nozzle in this embodiment. For example, an etching solution supply path may be formed in the rotating shaft 22 and the roller 21b so as to extend therethrough and to be open to the groove 21a. The rotating shaft 22 is coupled to a rotational driving unit (not shown), and transmits rotation of a desired rotation speed to the roller 21b.

A second vacuum chuck 31 is arranged at an upper position to oppose the first vacuum chuck 11 through the substrate 1, and is coupled to a driving unit (not shown) capable of horizontally and vertically moving the chuck 31. This driving unit includes a rotary mechanism, as needed, in order to rotate the second vacuum chuck 31 in cleaning and drying steps for substrates (to be described later). An exhaust hole 32 is formed inside the second vacuum chuck 31 so as to communicate with a vacuum pipe line (not shown) and to be open to a suction surface 33. An elastic seal member is arranged around the peripheral portion of the suction surface 33 as needed. The second vacuum chuck 31 is designed to hold the other major surface (to be referred to as an upper surface hereinafter) of the substrate 1 by suction and to move and stop the substrate to an upper position which is a predetermined distance away from the upper surface 19.

A semiconductor substrate cleaning mechanism 41 includes an end surface cleaning nozzle 42 and a cleaning nozzle 43. The cleaning nozzle 42 is arranged at a position to oppose the side surface of the substrate 1 held by the first vacuum chuck 11 so that a cleaning solution can be sprayed on the end surface including the side surface of the substrate 1. The cleaning nozzle 43 is arranged at a position to oppose the side surface of a region defined by the predetermined distance between the upper surface 19 of the first vacuum chuck 11 and the lower surface of the substrate 1 held by the second vacuum chuck 31 by suction. The cleaning nozzle 43 is used to spray a cleaning solution on this region.

A semiconductor substrate drying mechanism 50 includes the exhaust holes 15 communicating with the hollow portion 14 of the first vacuum chuck 11, the $N_2$ gas pipe line coupled to the rotating shaft 16 through the valve 18, and a rotational driving unit (not shown) which can rotate at high speed and is coupled to the rotating shaft 16.

Figure 3A:
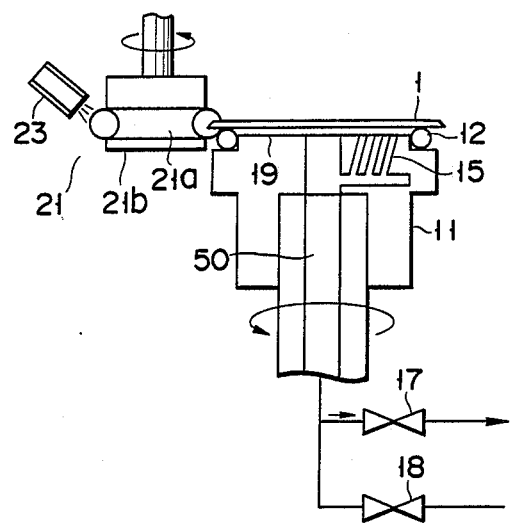
FIGS. 3A to 3D are views showing etching steps using the semiconductor substrate etching apparatus of the present invention.

An operation of the above-described semiconductor substrate etching apparatus will be described below with reference to FIGS. 3A to 3D. As shown in FIG. 3A, the semiconductor substrate 1 is placed on the first vacuum chuck 11. The valve 17 is then opened to evacuate the interior of the chuck 11 so as to hold the substrate 1 with a vacuum. The respective rotational driving units (not shown) are energized to rotate the first vacuum chuck 11 and the roller 21b in the opposite directions, as shown in FIG. 2B. An etching solution supplied from the etching solution supply nozzle 23 is held in the groove 21a of the roller 21b with surface tension. Since the groove 21a is arranged to cover the end surface of the substrate 1, the end surface is brought into contact with the etching solution upon rotation of the roller 21b and of the substrate 1. As a result, the etching solution is transferred onto the end surface, and an etching process of only the end surface is performed.

Figure 3B:
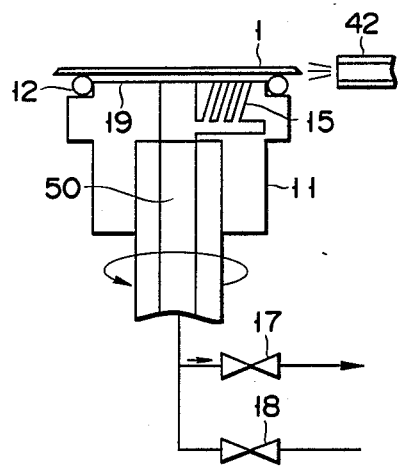

As shown in FIG. 3B, after the etching process, a cleaning solution (e.g., pure water) is sprayed from the end surface cleaning nozzle 42 on the end surface of the rotating substrate 1, thereby cleaning the end surface of the substrate 1 and removing the etching solution therefrom.

Figure 3C:
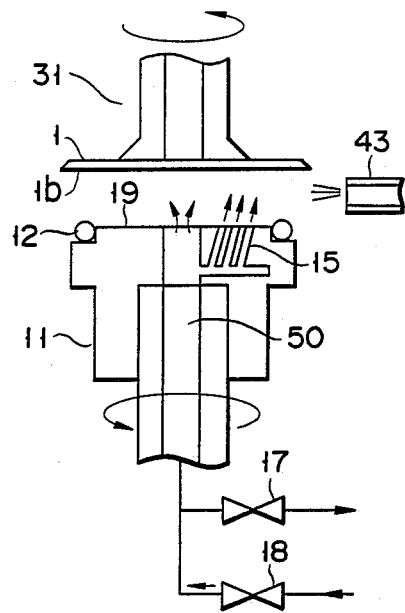

Subsequently, as shown in FIG. 3C, after cleaning the end surface, the second vacuum chuck 31 which moves to a position above the first vacuum chuck 11 is lowered to receive the substrate 1 from the first vacuum chuck 11 and hold it by vacuum suction. At the same time, the valve 17 is closed. After the substrate 1 is held by the second vacuum chuck 31, it is raised and stopped at a position at which the predetermined distance is defined between the lower surface 1b of the substrate 1 and the upper surface 19 of the first vacuum chuck 19. The first and second vacuum chucks 11 and 31 are rotated by the rotational driving units (not shown) in the opposite directions. The valve 18 for an $N_2$ gas is then opened to discharge the $N_2$ gas outward from the exhaust holes 15, and a cleaning solution is sprayed on the region defined by the predetermined distance using the cleaning nozzle 43. The upper surface 19 of the first vacuum chuck 11 and the lower surface 1b of the substrate 1 which rotates in the direction opposite to that of the vacuum chuck 11 are cleaned within a short period of time by the cleaning solution which is sprayed together with the discharged $N_2$ gas. It is apparent that the cleaning solution does not flow into the exhaust holes 15. After cleaning, a drying process is performed by flowing the $N_2$ gas for several seconds.

Figure 3D:
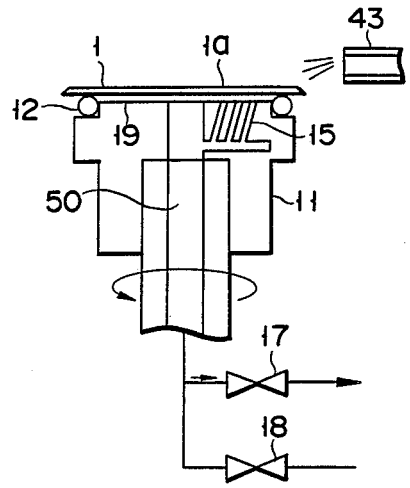

After drying, the valve 18 is closed to stop the $N_2$ gas. The second vacuum chuck 31 is lowered to transfer the substrate 1 on the O-ring 12 of the first vacuum chuck 1, as shown in FIG. 3D. The valve 17 is then opened to vacuum-chuck the substrate 1. After chucking, a cleaning solution is sprayed from the cleaning nozzle 43 on the rotating substrate 1 so as to clean the upper surface 1a of the substrate 1. After cleaning, the first vacuum chuck 11 is rotated at 3,000 rpm to dry the upper surface 1a.

When the semiconductor substrate etching apparatus of the above-described embodiment was used, the following effects were obtained:

(1) Since an etching solution was supplied from the groove of the roller to the end surface of each substrate, while entrance of the etching solution onto the upper and lower surface of the substrate is prevented by the centrifugal force and the elastic seal member (O-ring), a region to be etched was limited to the end surface of the substrate, and the manufacturing yield was increased.

(2) Since the etching solution was supplied to only the end surface of a substrate, the consumption of the chemicals was reduced to about 1/20 or less that in the conventional technique, thus saving large amounts of chemicals.

(3) Since a new etching solution was always supplied to the end surface of a substrate, no etching variations occurred.

(4) Since a cleaning solution was directly sprayed on the end surface of a substrate after etching, cleaning was performed within a short period of time, and only a small amount of cleaning solution was used.

(5) The lower surface of a substrate and the upper surface of the first vacuum chuck were cleaned by an $N_2$ gas flowing outward from the exhaust holes arranged in the rotating upper surface in a straight line and by a sprayed cleaning solution. Therefore, cleaning could be uniformly performed in a short period of time. In addition, a drying process of these surfaces could be performed using the flow of the $N_2$ gas within a short period of time.

(6) Since etching, cleaning, and drying were automatically performed at the same position, chipping of a substrate, which occurs while the substrate is picked up in the conventional technique, did not occur at all.

(7) Since an organic solution (Trichrene) harmful to a human body used in the conventional technique was not used, safety of operations was improved, and the pollution problems were eliminated.

(8) Since a coated antietching solution did not require removal, the etching process was shortened. In addition, since a chemical for removing the antietching solution was not required, a great reduction in running cost was realized.

As has been described above, according to the semiconductor substrate etching apparatus of the present invention, the problems of the conventional techniques can be solved, and an etching process can be limited to only the end surface of a substrate, thus automatically performing the etching process within a short period of time. In addition, since cleaning and drying steps after the etching process can be continuously and automatically performed, the manufacturing yield can be increased, the time required for the respective steps can be shortened, the consumption of chemicals can be reduced, and the safety of operations can be improved as compared with the conventional technique.

What is claimed is:

1. A semiconductor substrate etching apparatus comprising:

a rotatable first vacuum chuck having an elastic seal member, mounted around a peripheral portion of an upper surface, for horizontally placing and holding a semiconductor substrate in contact with one major surface thereof, and a hollow portion therein as an exhaust path, a plurality of exhaust holes being formed in said first vacuum chuck so as to communicate with the exhaust path and extend to the upper surface;

a semiconductor substrate end surface etching mechanism having a roller arranged near the semiconductor substrate, an end surface of the semiconductor substrate being inserted in a groove of said roller in a non-contact state, and means for supplying an etching solution for etching the end surface of the semiconductor substrate to said groove;

a rotatable or non-rotatable second vacuum chuck, which can be horizontally and vertically moved and, which can hold the other major surface of the semiconductor substrate by suction and move the semiconductor substrate to an upper position a predetermined distance away from the upper surface of said first vacuum chuck;

a semiconductor substrate cleaning mechanism having an end surface cleaning nozzle, arranged to oppose the end surface of the semiconductor substrate held by said first vacuum chuck, for spraying a cleaning solution on the end surface of the semiconductor substrate, and a cleaning nozzle, arranged to oppose a side surface of a region defined by the predetermined distance between the upper surface of said first vacuum chuck and the other major surface of the semiconductor substrate held by said second vacuum chuck, for spraying a cleaning solution on the region; and a semiconductor substrate drying mechanism for drying the one major surface of the semiconductor substrate by spraying a drying gas from said plurality of exhaust holes of said first vacuum chuck on the one major surface, and for drying the other major surface of the semiconductor substrate held by said first vacuum chuck.

2. The apparatus according to claim 1, wherein said exhaust holes are inclined with respect to the upper surface and extend to a periphery of the upper surface.

* * * * *